US008962378B2

(12) United States Patent
Euliss et al.

(10) Patent No.: US 8,962,378 B2
(45) Date of Patent: Feb. 24, 2015

(54) PHOTODIODE AND METHOD FOR MAKING THE SAME

(75) Inventors: Larken E. Euliss, Calabasas, CA (US); G. Michael Granger, Redmond, WA (US); Keith J. Davis, Seattle, WA (US); Nicole L. Abueg, Seattle, WA (US); Peter D. Brewer, Westlake Village, CA (US); Brett Nosho, Santa Monica, CA (US)

(73) Assignee: The Boeing Company, Chicago, IL (US)

( * ) Notice: Subject to any disclaimer, the term of this patent is extended or adjusted under 35 U.S.C. 154(b) by 0 days.

(21) Appl. No.: 13/549,905

(22) Filed: Jul. 16, 2012

(65) Prior Publication Data

US 2014/0014902 A1    Jan. 16, 2014

(51) Int. Cl.
*H01L 21/00* (2006.01)

(52) U.S. Cl.
USPC ............... 438/95; 257/E27.124; 257/E31.029

(58) Field of Classification Search
USPC .................. 257/E27.124, E27.125, E31.029, 257/E31.058, E31.063, E25.007, E25.032; 438/91–95, FOR. 137
See application file for complete search history.

(56) References Cited

U.S. PATENT DOCUMENTS

| 7,341,917 | B2 | 3/2008 | Milliron et al. |
| 7,494,841 | B2 | 2/2009 | Mitzi et al. |
| 7,517,718 | B2 | 4/2009 | Mitzi et al. |
| 7,888,700 | B2 * | 2/2011 | Kahen ............................ 257/103 |
| 2003/0010987 | A1 * | 1/2003 | Banin et al. ..................... 257/82 |
| 2003/0057495 | A1 * | 3/2003 | Gong et al. .................... 257/352 |
| 2003/0129759 | A1 * | 7/2003 | Lewis et al. .................... 436/58 |
| 2006/0062902 | A1 * | 3/2006 | Sager et al. ..................... 427/74 |
| 2007/0099359 | A1 * | 5/2007 | Klimov et al. ................ 438/183 |
| 2007/0132052 | A1 * | 6/2007 | Sargent et al. ................ 257/443 |
| 2009/0283138 | A1 * | 11/2009 | Lin et al. ........................ 136/255 |
| 2010/0176369 | A2 * | 7/2010 | Oliver et al. .................... 257/13 |
| 2011/0240120 | A1 * | 10/2011 | Ronda et al. .................. 136/257 |
| 2012/0082848 | A1 | 4/2012 | Euliss et al. |
| 2013/0019930 | A1 * | 1/2013 | Semonin et al. .............. 136/255 |
| 2013/0042906 | A1 * | 2/2013 | Lee ................................ 136/255 |

OTHER PUBLICATIONS

Tang et al., "Colloidal-quantum-dot photovoltaics using atomic-ligand passivation," *Nature Materials*, vol. 10, pp. 765-771 (2011).
Talapin et al., "PbSe Nanocrystal Solids for n- and p-Channel Thin Film Field-Effect Transistors," *Science*, vol. 310, pp. 86-89 (2005).
Lee et al., "Band-like transport, high electron mobility and high photoconductivity in all-inorganic nanocrystal arrays," *Nature Nanotechnology*, vol. 6, pp. 348-352 (2011).
Thathachary et al., "Fermi level depinning at the germanium Schottky interface through sulfer passivation," *Applied Physics Letters*, vol. 96, 152108 (2010).

* cited by examiner

*Primary Examiner* — William F Kraig
*Assistant Examiner* — Khaja Ahmad
(74) *Attorney, Agent, or Firm* — Walters & Wasylyna LLC

(57) ABSTRACT

A method for manufacturing a photodiode including the steps of providing a substrate, solution depositing a quantum nanomaterial layer onto the substrate, the quantum nanomaterial layer including a number of quantum nanomaterials having a ligand coating, and applying a thin-film oxide layer over the quantum nanomaterial layer.

12 Claims, 3 Drawing Sheets

Figure 1:
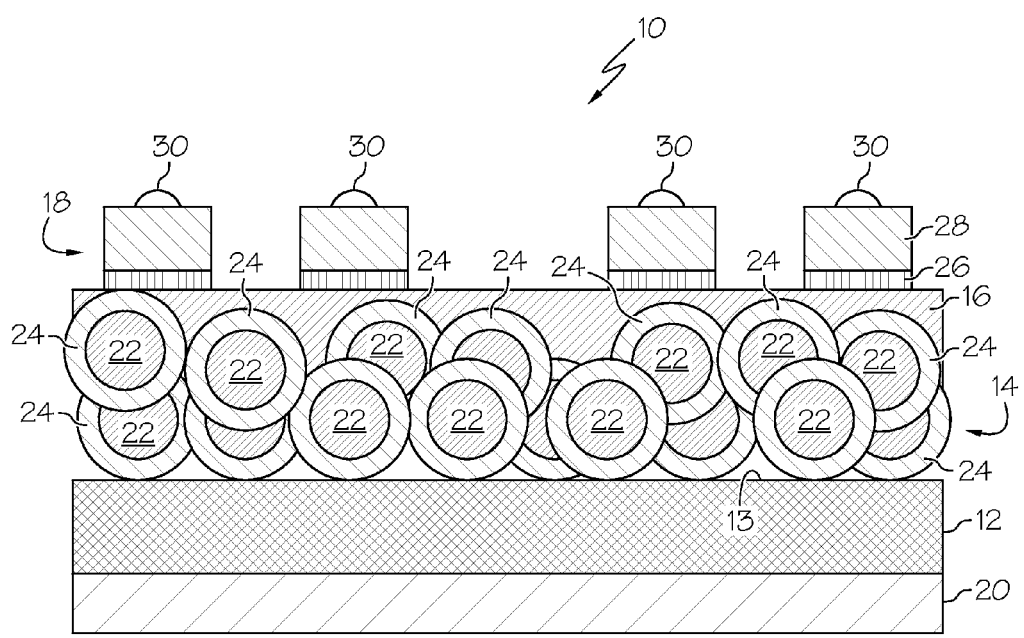

PHOTODIODE AND METHOD FOR MAKING THE SAME

FIELD

This application relates to photovoltaic devices and, more particularly, to photodiodes formed with quantum nanomaterials and, even more particularly, to photodiodes formed with quantum nanomaterials using solution processing techniques.

BACKGROUND

Photodiodes convert the sun's energy into useful electrical energy (current or voltage) by way of the photovoltaic effect. Modern photodiodes are relatively lightweight and they operate at relatively high efficiencies. Therefore, photodiodes provide a reliable, lightweight and sustainable source of electrical energy suitable for a variety of applications, including terrestrial and space applications.

Photodiodes are typically fabricated using vacuum deposition techniques to grow thin layers of semiconductor material on a substrate. The resulting photodiodes may then be electrically interconnected in large arrays to harvest the sun's energy and produce useful electrical energy.

Unfortunately, vacuum deposition techniques generally require a substrate having a relatively small surface area (less than 1 $ft^2$) for proper growth and, therefore, are not suitable for large surface area applications. Furthermore, vacuum deposition techniques are generally not suitable for curved surfaces and, therefore, are limited to relatively small, flat substrates. Still furthermore, vacuum deposition techniques are relatively expensive and, therefore, significantly contribute to the overall cost of photodiodes.

Accordingly, those skilled in the art continue with research and development efforts in the field of lightweight, high efficiency photodiodes, including the fabrication of lightweight, high efficiency photodiodes.

SUMMARY

In one embodiment, disclosed is a method for manufacturing a photodiode. The method may include the steps of (1) providing a substrate, (2) solution depositing (e.g., spin coating) a quantum nanomaterial layer onto the substrate, the quantum nanomaterial layer including quantum nanomaterials having a ligand coating, and (3) applying a thin-film oxide layer over the quantum nanomaterial layer.

In another embodiment, the disclosed method may include the steps of (1) providing a substrate, (2) solution depositing (e.g., spin coating) a quantum nanomaterial layer onto the substrate, the quantum nanomaterial layer including quantum nanomaterials having a ligand coating, and (3) solution depositing (e.g., spin coating) a thin-film oxide layer over the quantum nanomaterial layer.

In another embodiment, the disclosed method may include the steps of (1) providing a substrate, (2) forming bottom contacts on the substrate, (3) solution depositing (e.g., spin coating) a quantum nanomaterial layer onto the substrate, the quantum nanomaterial layer including quantum nanomaterials (e.g., tin-telluride and/or lead-tin-telluride) having a ligand coating (e.g., a metal halide ligand and/or a metal chalcogenide complex), (4) applying a thin-film oxide layer over the quantum nanomaterial layer, and (5) forming top contacts on the thin-film oxide layer.

In another embodiment, the disclosed photodiode may include (1) a substrate, (2) a solution-cast quantum nanomaterial layer positioned on the substrate, the solution-cast quantum nanomaterial layer including tin-telluride quantum nanomaterials having a ligand coating, wherein the ligand coating includes a metal halide ligand and/or a metal chalcogenide complex, wherein the metal chalcogenide complex includes tin and/or a transition metal, and (3) a thin-film oxide layer over the solution-cast quantum nanomaterial layer.

In yet another embodiment, the disclosed photodiode may include (1) a substrate, (2) a solution-cast quantum nanomaterial layer positioned on the substrate, the solution-cast quantum nanomaterial layer including lead-tin-telluride quantum nanomaterials having a ligand coating, wherein the ligand coating includes a metal halide ligand and/or a metal chalcogenide complex, wherein the metal chalcogenide complex includes tin and/or a transition metal, and (3) a thin-film oxide layer over the solution-cast quantum nanomaterial layer.

Other embodiments of the disclosed photodiode and method for making the same will become apparent from the following detailed description, the accompanying drawings and the appended claims.

BRIEF DESCRIPTION OF THE DRAWINGS

FIG. 1 is a schematic side elevational view, in section, of one embodiment of the disclosed photodiode;

FIG. 2 is a flow chart illustrating one embodiment of the disclosed method for making a photodiode; and FIGS. 3A and 3B are graphical illustrations of the current-voltage characteristics of one example of the disclosed photodiode, shown prior to being illuminated (FIG. 3A) and while being illuminated (FIG. 3B).

DETAILED DESCRIPTION

It has now been discovered that photodiodes may be manufactured using solution deposition techniques, such as spin coating, stamping or printing. The disclosed solution deposition techniques may be used to manufacture photodiodes configured to operate within a particular wavelength range (e.g., long wave infrared) at a relatively lower cost than using traditional vapor deposition techniques. Furthermore, the disclosed solution deposition techniques may be used for large surface area (>1 $ft^2$) applications, and may be used on flat, as well as curved, surfaces.

Referring to FIG. 1, one embodiment of the disclosed photodiode, generally designated 10, may include a substrate layer 12, a quantum nanomaterial layer 14 and a thin-film oxide layer 16. A first contact layer 18 may be applied over the thin-film oxide layer 16. Optionally, a second contact layer 20 may be applied over the substrate layer 12.

The substrate layer 12 may provide the surface upon which the quantum nanomaterial layer 14 may be deposited. Those skilled in the art will appreciate that various materials (or combination of materials) may be used to form the substrate layer 12 without departing from the scope of the present disclosure.

In a first variation, the substrate layer 12 may be formed from a semiconductor material. For example, the substrate layer 12 may be formed from germanium, such as germanium that starts as p-type germanium or germanium that has been doped p-type germanium. However, various semiconductor substrate materials may be used to form the substrate layer 12, and the semiconductor substrate materials may optionally be doped to achieve the desired electrical properties.

Optionally, the semiconductor substrate material (e.g., germanium) may be subjected to sulfur passivation (S-passivation). While various sulfur passivation techniques may be used, one suitable example includes aqueous $(NH_4)_2S$ treatment, as described in greater detail in Thathachary A. V. et al., "Fermi Level Depinning at the Germanium Schottky Interface Through Sulfur Passivation," *Appl. Phys. Lett.* 96, 152108 (2010), the entire contents of which are incorporated herein by reference. Without being limited to any particular theory, it is believed that sulfur passivation of the semiconductor substrate material may de-pin the Fermi level at the surface of the semiconductor substrate material to make repeatable ohmic contacts to the semiconductor substrate.

In a second variation, the substrate layer 12 may be formed from a non-semiconductor material. Various non-semiconductor materials, such conductive materials, non-conductive materials, flexible materials and rigid materials, are contemplated. The non-semiconductor materials may be coated with various materials, such as conductors and/or insulators, to achieve the desired electrical properties.

In one expression of the second variation, the substrate layer 12 may include a conductive, flexible foil, such as a metal foil. The conductive, flexible foil may be coated with a thin layer (e.g., 25 nanometers or less) of insulator. As one example, the insulator may be applied using a solution process, such as solution-processed aluminophosphate or solution-processed hafnium oxysulfate. As another example, the insulator may be applied using a physical vapor deposition process. Without being limited to any particular theory, it is believed that the insulator may allow carriers to tunnel through to the underlying conductive, flexible foil, but may preclude direct contact between the quantum nanomaterial layer 14 and the conductive, flexible foil, which may quench the desired properties of the quantum nanomaterials in the quantum nanomaterial layer 14.

In another expression of the second variation, the substrate layer 12 may include a non-conductive polymeric film, such as polyetheretherketone. The non-conductive polymeric film may be coated with a thin, highly conductive layer. For example, the thin, highly conductive layer may be a thin metal (e.g., silver) layer applied using a physical vapor deposition process. Then, the thin, highly conductive layer may be coated with a thin layer (e.g., 25 nanometers or less) of insulator, such as by using a solution process or a physical vapor deposition process, as described above.

The quantum nanomaterial layer 14 may include a plurality of quantum nanomaterials 22 applied onto a surface 13 of the substrate layer 12 as a thin film using a solution deposition technique. Examples of suitable solution deposition techniques include spin coating, stamping and printing.

The quantum nanomaterials 22 may be quantum dots, quantum rods, nano-tetrapods or any other nanocrystalline semiconductor material. As one specific example, the quantum nanomaterials 22 may be tin-telluride (SnTe) quantum dots. As another specific example, the quantum nanomaterials 22 may be lead-tin-telluride ($Pb_{(1-x)}Sn_xTe$, where x is a number between 0.1 and 0.6) quantum dots.

The quantum nanomaterials 22 may be tuned to absorb infrared radiation, such as infrared radiation within the bandwidth of mid-wavelength infrared (3-5 micrometers) and long-wavelength infrared (5-15 micrometers). Tuning the quantum nanomaterials 22 to absorb infrared radiation within the mid-wavelength and long-wavelength infrared spectrum may require specific material selection (e.g., forming the quantum nanomaterials 22 from tin-telluride or lead-tin-telluride) and growing the quantum nanomaterials 22 to a particular size, as described in greater detail in U.S. patent application Ser. No. 13/022,705 ("Nanomaterial Having Tunable Infrared Absorption Characteristics and Associated Method of Manufacture") filed on Feb. 8, 2011, the entire contents of which are incorporated herein by reference. As one example, the quantum nanomaterials 22 may be formed from tin-telluride (SnTe) and may have a maximum cross-sectional dimension of between about 15 and about 50 nanometers. As another example, the quantum nanomaterials 22 may be formed from lead-tin-telluride ($Pb_xSn_{(1-x)}Te$, where x is a number between 0.1 and 0.6) and may have a maximum cross-sectional dimension of at least about 7.5 nanometers.

The quantum nanomaterials 22 may include a ligand coating 24. The ligand coating 24 may include an inorganic ligand or a combination of inorganic ligands. The use of organic ligands is also contemplated. Without being limited to any particular theory, it is believed that the ligand coating 24 may bind-up bonds on the surface of the quantum nanomaterials 22, and may allow closer spacing between adjacent quantum nanomaterials 22 within the quantum nanomaterial layer 14.

In one formulation, the ligand coating 24 may include a metal chalcogenide complex ("MCC"). The metal chalcogenide complex may include a metal and a chalcogen, such as sulfur, selenium or tellurium, wherein the metal includes either tin and/or a transition metal. Examples of metal chalcogenide complexes suitable for use as the ligand coating 24 include tin-sulfide (SnS), tin-selenide (SnSe) and tin-telluride SnTe.

In another formulation, the ligand coating 24 may include a metal halide ligand. For example, the halide may be iodide, bromide and/or chloride. An example of a metal halide ligand suitable for use as the ligand coating 24 is titanium chloride ($TiO_4$).

The ligand coating 24 may be applied to the quantum nanomaterials 22 using a ligand exchange process. The process of manufacturing quantum nanomaterials 22 may result in quantum nanomaterials 22 having a coating (e.g., oleic acid) already on the surface thereof. The ligand exchange process may substitute the original coating (e.g., oleic acid) for the desired ligand coating 24 (e.g., SnS, SnSe or SnTe).

As one non-limiting example, a dispersion of quantum nanomaterials 22 having a ligand coating 24 suitable for forming the quantum nanomaterial layer 14 may be prepared as follows. First, tin-telluride (SnTe) nanocrystals may be manufactured as described in U.S. patent application Ser. No. 13/022,705. The manufacturing process may be controlled such that the resulting tin-telluride nanocrystals are tuned to the desired wavelength (e.g., long-wavelength infrared). The tin-telluride nanocrystals may have an oleic acid coating, and may be dispersed in hexane. Second, a ligand exchange reaction may be performed to coat the tin-telluride nanocrystals with a tin-sulfide (SnS) metal chalcogenide complex. Finally, the SnS-coated tin-telluride nanocrystals may be dispersed in hydrazine.

To form the quantum nanomaterial layer 14, the dispersion of SnS-coated tin-telluride nanocrystals in hydrazine may be solution deposited onto the substrate layer 14, such as by spin coating, stamping or printing. The solution deposition process (e.g., spin coating) may continue until the desired cross-sectional thickness of the quantum nanomaterial layer 14 is achieved. Then, after solution deposition, the resulting layered structure may be heat-treated (e.g., 60 minutes at 280° C.).

The thin-film oxide layer 16 may be applied over the quantum nanomaterial layer 14, and may optionally infiltrate the quantum nanomaterial layer 14. The thin-film oxide layer 16 may be electrically conductive, and may be generally transparent to the electromagnetic radiation intended to be absorbed by the quantum nanomaterial layer 14.

The thin-film oxide layer 16 may be formed from an amorphous oxide semiconductor. Those skilled in the art will appreciate that various amorphous oxide semiconductors may be used to form the thin-film oxide layer 16. Two specific examples of amorphous oxide semiconductors suitable for forming the thin-film oxide layer 16 are zinc-tin-oxide (ZTO) and indium-gallium-zinc-oxide (IGZO).

In one construction, the thin-film oxide layer 16 may be formed using a solution deposition process. For example, the thin-film oxide layer 16 may be formed by synthesizing indium-gallium-zinc-oxide (IGZO) using a solution deposition process. A suitable IGZO solution was obtained from Inpria Corporation of Corvallis, Oreg. The resulting solution deposited thin-film oxide layer 16 may be heat treated for 60 minutes at 300° C.

In another construction, the thin-film oxide layer 16 may be formed using a physical vapor deposition process. For example, the thin-film oxide layer 16 may be formed from zinc-tin-oxide (ZTO) using vacuum deposition.

Thus, the quantum nanomaterial layer 14 may be positioned between the substrate layer 12 and the thin-film oxide layer 16. Additional layers may be incorporated into the photodiode 10 without departing from the scope of the present disclosure.

The first contact layer 18 may be applied over the thin-film oxide layer 16 and may be electrically coupled to the thin-film oxide layer 16. The first contact layer 18 may be formed from a conductive metal 28, such as gold, platinum, nickel, aluminum and/or tantalum. An optional tie layer 26, such as titanium, may be positioned between the conductive metal 28 of the first contact layer 18 and the thin-film oxide layer 16 to enhance bonding between the conductive metal 28 and the underlying thin-film oxide layer 16.

The first contact layer 18 may be applied to the thin-film oxide layer 16 in various patterns (e.g., a grid pattern) using various techniques. As one example, the first contact layer 18 may be applied using a stamping process. As another example, the first contact layer 18 may be applied using a physical vapor deposition process (evaporation or sputtering), wherein lithography may be used to define the pattern of the first contact layer 18.

Optionally, indium bumps 30 may be applied to (e.g., evaporated onto) the first contact layer 18.

The second contact layer 20 may optionally be applied over the substrate layer 12 and may be electrically coupled to the substrate layer 12. The second contact layer 20 may be formed from a conductive metal, such as gold, platinum, nickel, aluminum and/or tantalum.

Figure 2:
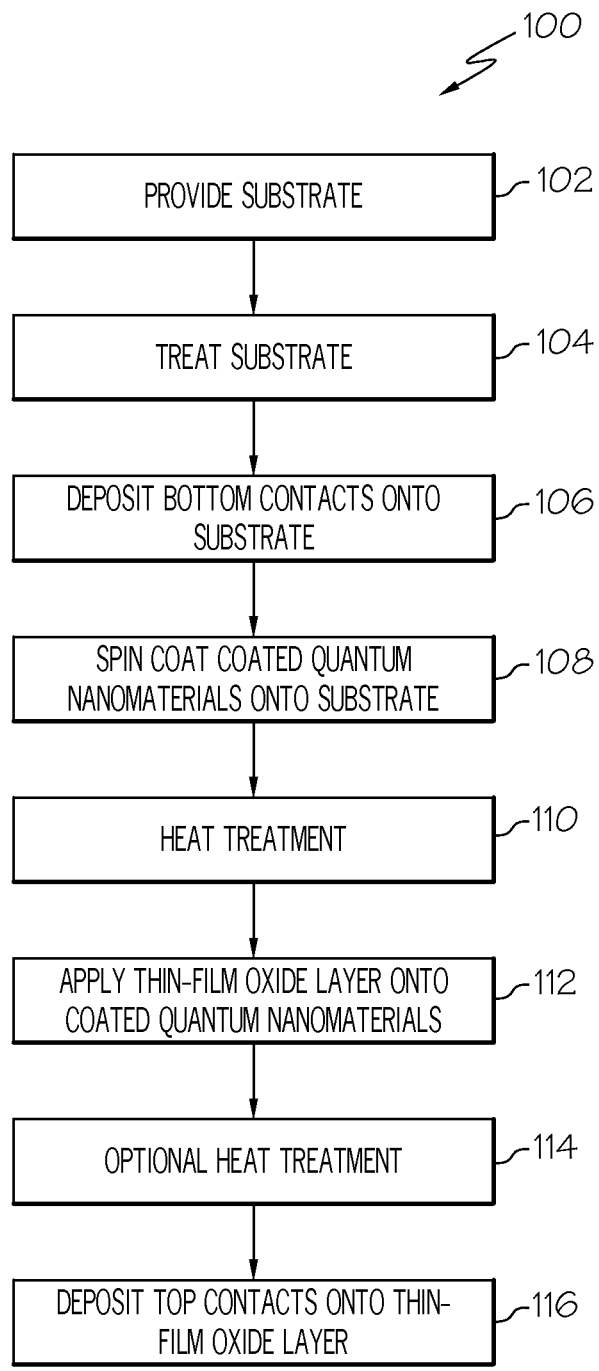

Also disclosed is a method for manufacturing a photodiode. Referring to FIG. 2, one embodiment of the disclosed method for manufacturing a photodiode, generally designated 100, may begin at Block 102 with the step of providing a substrate. For example, the substrate provide at Block 102 may be germanium.

At Block 104, the substrate may be treated. As one treatment, the substrate may be doped. For example, the germanium substrate may be doped with p-type dopants to achieve a charge carrier density of about $10^{13}$ cm$^{-3}$. As another treatment, the substrate may be subjected to sulfur passivation. For example, the p-doped germanium substrate may be passivated in a $(NH_4)_2S$ solution for 30 minutes with a sheet resistance of 24.5 to 27.5 ohms/square. After sulfur passivation, the substrate may be: (1) cleaned in an HCL/HBr solution for five minutes; (2) rinsed with de-ionized water for 5 minutes and blown dry with $N_2$; (3) treated with a 40% aqueous ammonium sulfide solution at 50° C. for 5 minutes; then (4) rinsed with de-ionized water for 5 minutes and blown dry with $N_2$.

At Block 106, the bottom contacts may be applied to the substrate. For example, the bottom contacts may be applied as follows: (1) lithography may be performed on the germanium substrate; (2) a metal, such as gold, platinum, nickel, aluminum and/or tantalum, may be applied (e.g., sputtered) over the lithography; and (3) the lithography may be lifted-off to define the bottom contacts. Optionally, AMD may be performed, followed by a di-ionized water rinse for 5 minutes, followed by ozone treatment for 10 to 30 minutes.

At Block 108, a quantum nanomaterial layer may be applied to the substrate using a solution deposition technique, such as spin coating, stamping or printing. For example, the dispersion of SnS-coated tin-telluride nanocrystals in hydrazine may be applied to the germanium substrate by spin coating to achieve the desired thickness. The SnS-coated tin-telluride nanocrystal layer (on the germanium substrate) may be heat treated for 60 minutes at 280° C., as shown at Block 110.

At Block 112, a thin-film oxide layer may be applied over the quantum nanomaterial layer. For example, an indium-gallium-zinc-oxide (IGZO) solution available from Inpria Corporation of Corvallis, Oreg., may be applied to the SnS-coated tin-telluride nanocrystal layer by spin coating to achieve the desired thickness (e.g., a single layer about 20 to 25 nanometers thick). The IGZO thin-film oxide layer (on the quantum nanomaterial layer, which is on the germanium substrate) may be heat treated for 60 minutes at 300° C., as shown at Block 114. As another example, the thin-film oxide layer (e.g., zinc-tin-oxide) may be applied over the quantum nanomaterial layer using a traditional physical vapor deposition (PVD) process or poly inorganic condensation (PIC) process, which may not require an additional, post-deposition heat treatment step.

Optionally, an ozone treatment step may be performed following formation of the thin-film oxide layer (e.g., after Block 114).

At Block 116, the top contacts may be applied to the thin-film oxide layer. For example, the top contacts may be applied as follows: (1) photolithography may be performed on the thin-film oxide layer to define the top contacts; (2) a metal, such as gold with an optional titanium tie layer, may be applied (e.g., sputtered) over the photolithography; and (3) the photolithography may be lifted-off to define the top contacts.

Optionally, an indium bumps application step may be performed following formation of the top contacts (e.g., after Block 116).

Figure 3A:
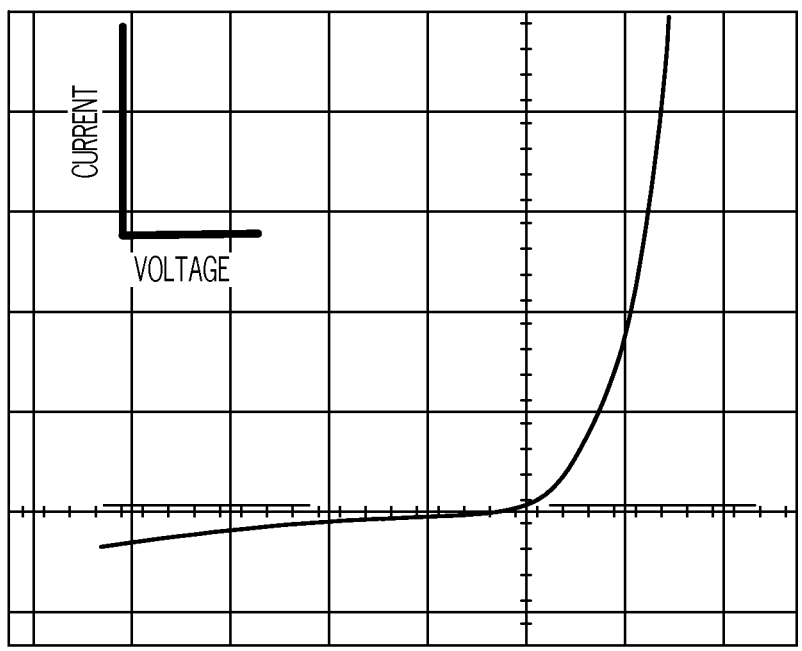
Figure 3B:
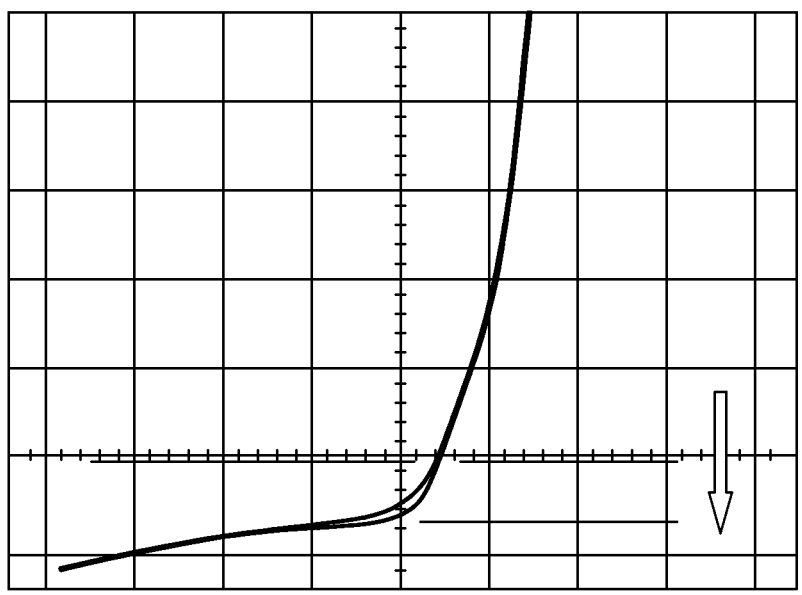

FIGS. 3A and 3B show the current-voltage characteristics of a photodiode manufactured in accordance with the disclosed method 100 on a sulfur passivated, p-type doped germanium substrate having a solution cast SnS-coated SnTe nanocrystal layer and a solution cast IGZO thin-film oxide layer. FIG. 3A shows the current-voltage characteristics of the photodiode prior to being illuminated and FIG. 3B shows the current-voltage characteristics of the photodiode during illumination.

Accordingly, the disclosed photodiodes may be manufacture using low-cost solution deposition processes. The solution deposition processes may facilitate scalable, large area (greater than 1 ft$^2$) fabrication of photodiodes on flat, as well as on curved, surfaces. Furthermore, careful selection of nanocrystal composition and size may facilitate tuning photodiodes to desired wavelength ranges (e.g., long-wavelength infrared).

Although various embodiments of the disclosed photodiode and method for making the same have been shown and described, modifications may occur to those skilled in the art upon reading the specification. The present application includes such modifications and is limited only by the scope of the claims.

What is claimed is:

1. A method for manufacturing a photodiode comprising steps of:
   providing a substrate comprising germanium;
   doping said substrate;
   subjecting said substrate to sulfur passivation;
   cleaning said substrate after said sulfur passivation;
   solution depositing a quantum nanomaterial layer onto said substrate, said quantum nanomaterial layer comprising a plurality of quantum nanomaterials, each quantum nanomaterial of said plurality comprising:
      a core comprising at least one of tin-telluride and lead-tin-telluride which is tuned to absorb radiation within a bandwidth of mid-wavelength infrared and long-wavelength infrared; and
      a ligand coating on said core comprising a metal chalcogenide complex comprising at least one of tin-sulfide, tin-selenide and tin-telluride, wherein said ligand coating is applied to said core using a ligand exchange reaction to substitute an original coating on said core; and
   applying a thin-film oxide layer over said quantum nanomaterial layer.

2. The method of claim 1 wherein said germanium is doped p-type germanium.

3. The method of claim 1 wherein said plurality of quantum nanomaterials is a plurality of quantum dots.

4. The method of claim 1 wherein said plurality of quantum nanomaterials comprise tin-telluride.

5. The method of claim 4 wherein said plurality of quantum nanomaterials have maximum cross-sectional dimension between about 15 nanometers and about 50 nanometers.

6. The method of claim 1 wherein said plurality of quantum nanomaterials comprise lead-tin-telluride.

7. The method of claim 6 wherein said plurality of quantum nanomaterials have maximum cross-sectional dimension of at least about 7.5 nanometers.

8. The method of claim 1 wherein said thin-film oxide layer is applied by a solution deposition process.

9. The method of claim 1 wherein said thin-film oxide layer comprises an amorphous oxide semiconductor.

10. The method of claim 1 further comprising a step of applying a first contact layer over said thin-film oxide layer.

11. The method of claim 1 further comprising a step of applying a second contact layer onto said substrate.

12. A method for manufacturing a photodiode comprising steps of:
    providing a substrate comprising germanium;
    doping said substrate;
    subjecting said substrate to sulfur passivation;
    cleaning said substrate after said sulfur passivation;
    solution depositing a quantum nanomaterial layer onto said substrate, said quantum nanomaterial layer comprising a plurality of quantum dots, each quantum dot of said plurality comprising:
       a core comprising at least one of tin-telluride and lead-tin-telluride which is tuned to absorb radiation within a bandwidth of mid-wavelength infrared and long-wavelength infrared; and
       a ligand coating on said core comprising at least one of tin-sulfide, tin-selenide and tin-telluride, wherein said ligand coating is applied to said core using a ligand exchange reaction to substitute an original coating on said core; and
    solution depositing a thin-film oxide layer over said quantum nanomaterial layer.

* * * * *